United States Patent
Nikkel et al.

(10) Patent No.: US 9,680,439 B2
(45) Date of Patent: Jun. 13, 2017

(54) METHOD OF FABRICATING ACOUSTIC RESONATOR WITH PLANARIZATION LAYER

(71) Applicant: Avago Technologies General IP (Singapore) Pte. Ltd., Singapore (SG)

(72) Inventors: Phil Nikkel, Loveland, CO (US); Stefan Bader, Fort Collins, CO (US); Robert Thalhammer, Bavaria (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 524 days.

(21) Appl. No.: 14/225,710

(22) Filed: Mar. 26, 2014

(65) Prior Publication Data

US 2015/0280679 A1    Oct. 1, 2015

(51) Int. Cl.
*H03H 3/02* (2006.01)
*H01L 41/18* (2006.01)
(Continued)

(52) U.S. Cl.
CPC ......... *H03H 3/02* (2013.01); *H01L 21/76807* (2013.01); *H01L 21/76814* (2013.01);
(Continued)

(58) Field of Classification Search
CPC . H01L 41/18; H01L 41/183; H01L 21/76807; H01L 21/76814; H03H 3/02;
(Continued)

(56) References Cited

U.S. PATENT DOCUMENTS 5,587,620 A   12/1996   Ruby et al.
5,873,153 A    2/1999   Ruby et al.
(Continued)

FOREIGN PATENT DOCUMENTS

DE    102010003129 A1   10/2010
DE    102010064001 A1    6/2011
(Continued)

OTHER PUBLICATIONS

Ranjan et al. "Strained Hexagonal ScN: A Material with Unusual Structural and Optical Properties," Physical Review Letters, Jun. 27, 2003, vol. 90, No. 25, The American Physical Society, USA.
(Continued)

*Primary Examiner* — A. Dexter Tugbang

(57) ABSTRACT

A method is provided for fabricating a bulk acoustic wave (BAW) resonator device. The method includes forming an etch stop layer over a bottom electrode and a substrate; forming a dielectric layer on the etch stop layer; forming a photomask over the dielectric layer defining an opening over the bottom electrode; etching a portion the dielectric layer through the opening of the photomask to the etch stop layer to create a corresponding opening in the dielectric layer; removing the photomask, leaving un-etched protruding portions of the dielectric layer around the opening in the dielectric layer; and removing the protruding portions of the dielectric layer, a portion of the etch stop layer located over the bottom electrode, and a minimal portion of the bottom electrode to provide a planarized surface including a top surface of the bottom electrode and an adjacent top surface of the dielectric layer deposited over the substrate.

16 Claims, 8 Drawing Sheets

(51) Int. Cl.
*H03H 3/04* (2006.01)
*H01L 21/768* (2006.01)
*H03H 9/17* (2006.01)

(52) U.S. Cl.
CPC ............ *H01L 41/18* (2013.01); *H01L 41/183* (2013.01); *H03H 3/04* (2013.01); *H03H 9/172* (2013.01); *H03H 9/173* (2013.01); *H03H 9/175* (2013.01); *H03H 2003/021* (2013.01); *H03H 2003/023* (2013.01); *H03H 2003/025* (2013.01); *Y10T 29/42* (2015.01)

(58) Field of Classification Search
CPC .......... H03H 3/04; H03H 9/172; H03H 9/173; H03H 9/175; H03H 2003/021; H03H 2003/023; H03H 2003/025; Y10T 29/42
See application file for complete search history.

(56) References Cited

U.S. PATENT DOCUMENTS

| | | | |
|---|---|---|---|
| 6,107,721 A | 8/2000 | Lakin | |
| 6,215,375 B1 | 4/2001 | Larson, III et al. | |
| 6,384,697 B1 | 5/2002 | Ruby | |
| 6,507,983 B1 | 1/2003 | Ruby et al. | |
| 6,548,943 B2 | 4/2003 | Kaitila et al. | |
| 6,936,837 B2 | 8/2005 | Yamada et al. | |
| 7,275,292 B2 | 10/2007 | Ruby et al. | |
| 7,280,007 B2 | 10/2007 | Feng et al. | |
| 7,345,410 B2 | 3/2008 | Grannen et al. | |
| 7,358,831 B2 | 4/2008 | Larson et al. | |
| 7,372,346 B2 | 5/2008 | Tilmans et al. | |
| 7,388,454 B2 | 6/2008 | Ruby et al. | |
| 7,629,865 B2 | 12/2009 | Ruby | |
| 7,758,979 B2 | 7/2010 | Akiyama et al. | |
| 8,431,031 B2 | 4/2013 | Pijolat | |
| 8,597,531 B2 | 12/2013 | Obernhuber et al. | |
| 9,099,983 B2* | 8/2015 | Burak | H03H 9/175 |
| 9,136,819 B2* | 9/2015 | Grannen | H03H 9/173 |
| 9,225,313 B2* | 12/2015 | Bradley | H03H 9/173 |
| 9,385,684 B2* | 7/2016 | Nikkel | H03H 9/173 |
| 9,401,692 B2* | 7/2016 | Burak | H03H 9/173 |
| 9,425,764 B2* | 8/2016 | Burak | H03H 9/175 |
| 2007/0205850 A1 | 9/2007 | Jamneala et al. | |
| 2008/0258842 A1 | 10/2008 | Ruby et al. | |
| 2010/0107389 A1 | 5/2010 | Nessler et al. | |
| 2010/0327697 A1 | 12/2010 | Choy et al. | |
| 2010/0327994 A1 | 12/2010 | Choy et al. | |
| 2011/0084779 A1* | 4/2011 | Zhang | H03H 3/02 333/187 |
| 2013/0075821 A1* | 3/2013 | Baars | H01L 21/76814 257/368 |
| 2013/0106534 A1 | 5/2013 | Burak et al. | |
| 2013/0321100 A1 | 12/2013 | Wang | |

FOREIGN PATENT DOCUMENTS

DE 102010006401 A1 8/2011
JP 2008131194 A * 6/2008

OTHER PUBLICATIONS

Farrer et al., "Properties of hexagonal ScN versus wurtzite GaN and InN," Physical Review B, Nov. 20, 2002, vol. 66, No. 20, The American Physical Society, USA.

Constantin et al., "Composition-dependent structural properties in ScGaN alloy films: A combined experimental and theoretical study," Journal of Applied Physics, Dec. 16, 2005, vol. 98, No. 12, American Institute of Physics, USA.

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010.

Wencheng Xu et al., "In-Liquid Quality Factor Improvement for Film Bulk Acoustic Resonators by Integration of Microfluidic Channels", IEEE Electron Device Letters, vol. 30, No. 6, Jun. 2009, pp. 647-649.

Friedel Gerfers et al., "Sputtered AlN Thin Films for Piezoelectric MEMS Devices—FBAR Resonators and Accelerometers", Solid State Circuits Technologies, Jan. 2010, pp. 333-352.

German Office Action with English translation dated Dec. 5, 2014.

* cited by examiner

METHOD OF FABRICATING ACOUSTIC RESONATOR WITH PLANARIZATION LAYER

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a bottom (first) electrode and a top (second) electrode over a cavity. BAW resonators may be used in a wide variety of electronic applications, such as cellular telephones, personal digital assistants (PDAs), electronic gaming devices, laptop computers and other portable communications devices. For example, FBARs operating at frequencies close to their fundamental resonance frequencies may be used as a key component of radio frequency (RF) filters and duplexers in mobile devices.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

FIG. 1 is a cross-sectional view of a conventional acoustic resonator device, fabricated in accordance with a conventional method of fabrication.

Referring to FIG. 1, acoustic resonator device 100 includes a substrate 105, which defines a cavity 110 enabling acoustic reflection. A bottom electrode 120 is formed on the substrate 105 over the cavity 110. A piezoelectric layer 130 is formed on the substrate 105 and the bottom electrode 120, and a top electrode 140 is formed on a portion the piezoelectric layer 130 that extends over the bottom electrode 120. The bottom electrode 120, the portion of the piezoelectric layer 130 extending over the bottom electrode 120, and the top electrode 140, define an active area of the acoustic resonator device 100.

Notably, the bottom electrode 120 extends beyond the outer edge of the cavity 110, but does not extend to the (connecting) edge the substrate 105. Therefore, when the piezoelectric layer 130 is applied, it spans two levels, including a transition portion where the piezoelectric material transitions between a top surface of the substrate 105 to a top surface of the bottom electrode 120. This configuration increases the chances of defects being formed in the piezoelectric layer 130, such as cracks and voids, particularly for a relatively thick bottom electrode 120. Also, such defects effectively lower the breakdown voltage of the piezoelectric layer 130, enabling the piezoelectric layer 130 to withstand less electro-static discharge (ESD).

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
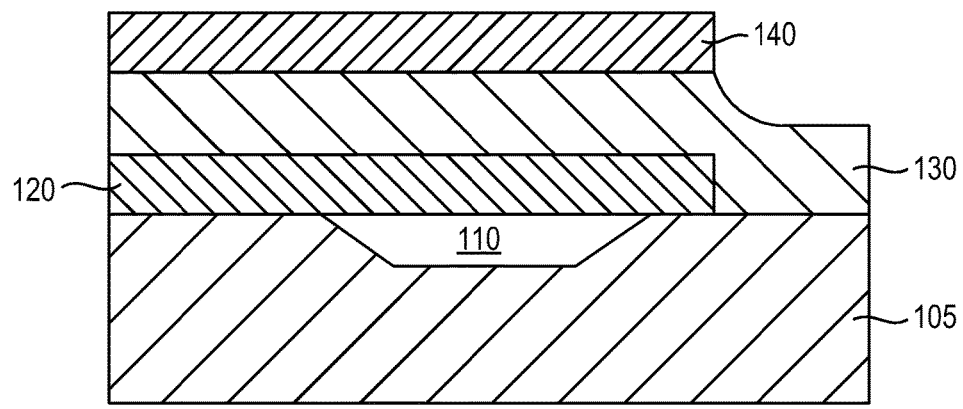
FIG. 1 is a cross-sectional view of a conventional acoustic resonator device.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), although the discussion is directed to FBARs for the sake of convenience. Certain details of acoustic resonators, including materials and methods of fabrication, may be found in one or more of the following commonly owned U.S. patents and patent applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkel et al. (issued as U.S. Pat. No. 9,385,684 on Jul. 5, 2016); U.S. patent application Ser. No. 13/663,449 to Burak et al. (issued as U.S. Pat. No. 9,401,692 on Jul. 26, 2016); U.S. patent application Ser. No. 13/660,941 to Burak et al. (issued as U.S. Pat. No. 9,425,764 on Aug. 23, 2016); U.S. patent application Ser. No. 13/654,718 to Burak et al. (issued as U.S. Pat. No. 9,099,983 on Aug. 4, 2015); U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In certain embodiments described below, a method is provided for fabricating an acoustic resonator device having a bottom electrode formed over a substrate (and an acoustic reflector), a piezoelectric layer disposed on the bottom electrode, and a top electrode disposed on the piezoelectric layer. The acoustic resonator device also includes a planarization layer formed of dielectric material adjacent to the bottom electrode over the substrate, such that the planarization layer and the bottom electrode collectively provide a planar top surface on which the piezoelectric layer is formed. The method includes applying an etch stop layer over the substrate and the bottom electrode to enable etching of the dielectric material over the bottom electrode. Protruding portions of the dielectric material and most of the etch stop layer are removed, except for portions of the etch stop layer between the dialectric material and the bottom electrode and below the dielectric material, in order to planarize the combined top surfaces. The planarized surface of the resulting acoustic resonator device provides a more structurally and operationally stable piezoelectric layer, substantially free of cracks and voids that may otherwise result when formed according to conventional techniques.

Thus, in accordance with a representative embodiment, a method is provided for fabricating a bulk acoustic wave (BAW) resonator device. The method includes forming a bottom electrode over a substrate; forming an etch stop layer over the bottom electrode and the substrate; forming a dielectric layer on the etch stop layer over the bottom electrode and the substrate; forming a photomask over the dielectric layer, the photomask defining an opening over the bottom electrode, wherein the opening is slightly smaller than the bottom electrode; etching a portion the dielectric layer through the opening of the photomask to the etch stop layer to create a corresponding opening in the dielectric layer; removing the photomask, leaving un-etched protruding portions of the dielectric layer around the opening in the dielectric layer; and removing the protruding portions of the dielectric layer, a portion of the etch stop layer located over the bottom electrode, and a minimal portion of the bottom electrode to provide a planarized surface comprising a top surface of the bottom electrode and an adjacent top surface of the dielectric layer deposited over the substrate.

In accordance with another representative embodiment, a BAW resonator device includes a substrate; a bottom electrode formed over the substrate; a dielectric layer formed over the substrate adjacent to the bottom electrode; an etch stop layer having a vertical portion separating the dielectric layer from the bottom electrode and a horizontal portion separating the dielectric layer from the substrate, where a top surface of the bottom electrode, a top surface of the adjacent dielectric layer and an exposed top end of the vertical portion of the etch stop layer form a planarized surface; a piezoelectric layer formed on the planarized surface; and a top electrode formed on the piezoelectric layer. Formation of the piezoelectric layer on the planarized surface increases a breakdown voltage of the piezoelectric layer.

Figure 2A:
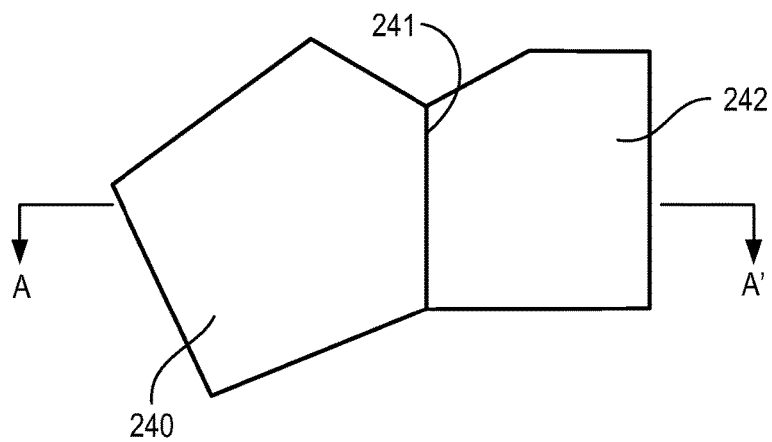
FIG. 2A is a top view of an acoustic resonator device, according to a representative embodiment.
Figure 2B:
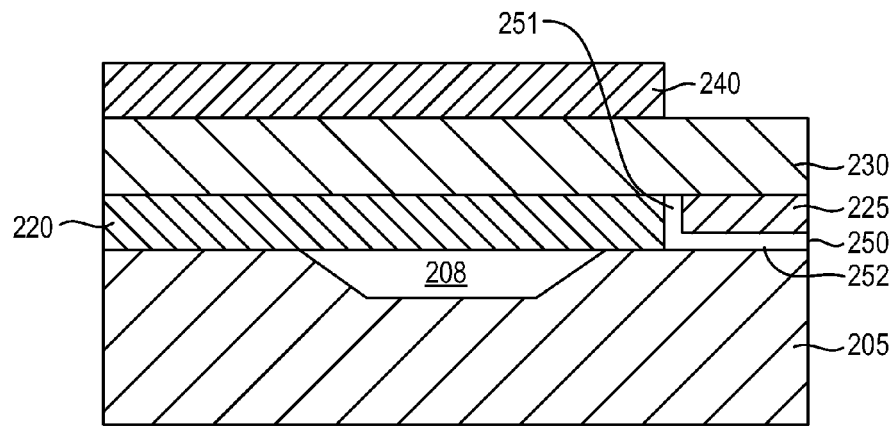
FIG. 2B is a cross-sectional view of an acoustic resonator device, according to a representative embodiment.
Figure 2C:
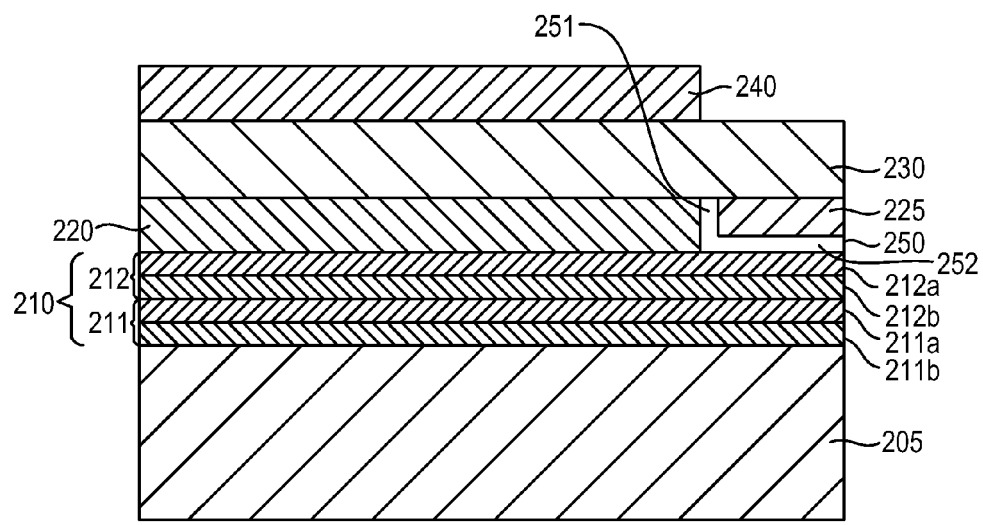
FIG. 2C is a cross-sectional view of an acoustic resonator device, according to another representative embodiment.

FIG. 2A is a top view of acoustic resonator 200, according to a representative embodiment, and FIGS. 2B and 2C are cross-sectional views of acoustic resonator 200, taken along a line A-A', according to different embodiments. In particular, FIG. 2B is a cross-sectional view of acoustic resonator 200-1, which is a representative FBAR including an air cavity (cavity 208) as the acoustic reflector, and FIG. 2C is a cross-section a view of acoustic resonator 200-2, which is a representative SMR including an acoustic mirror (e.g., distributed Bragg reflector (DBR) 210) as the acoustic reflector. Thus both FIGS. 2A and 2B depict examples of BAW resonator devices. However, it is understood that the various embodiments may be incorporated into other types of acoustic resonators, without departing from the scope of the present teachings.

Referring to FIG. 2A, acoustic resonator 200 comprises a top electrode 240 having five (5) sides, with a connection side 241 configured to provide an electrical connection to interconnect 242. Interconnect 242 provides electrical signals to the top electrode 240 to excite desired acoustic waves in a piezoelectric layer (not shown in FIG. 2A) of acoustic resonator 200.

It is generally understood that the same general configurations discussed below may be included in acoustic resonators having various integrated and/or add-on lateral features, such as frames, collars, and the like, at various locations within the acoustic resonators, without departing from the scope of the present teachings.

Referring to FIG. 2B, acoustic resonator 200-1 comprises a substrate 205 that defines a cavity 208 (e.g., air cavity) formed within the substrate 205. A bottom electrode 220 is disposed on the substrate 205 over the cavity 208. In an embodiment, a thin flexible membrane (not shown) may be included between the substrate 205 and the bottom electrode 220, without departing from the scope of the present teachings. A dielectric layer 225 (which may also be referred to a planarization layer) is formed next to the bottom electrode 220 and over the substrate 205. The dielectric layer 225 is separated from the bottom electrode 220 and the substrate 205 by a thin etch stop layer 250 remaining from the fabrication process, an example of which is discussed below with reference to FIGS. 4A to 4J. More particularly, the dielectric layer 225 is separated from the bottom electrode 220 by a substantially vertical portion 251 of the etch stop layer 250 (along the y-axis) and is separated from the substrate 205 by a substantially horizontal portion 252 of the etch stop layer 250 (along the x-axis). A top surface of the bottom electrode 220 and a top surface of the dielectric layer 225, along with an exposed top end of the vertical portion 251 of the etch stop layer 250, are planarized, meaning that they collectively form a combined planarized surface 229.

A piezoelectric layer 230 is disposed on the planarized surface of the bottom electrode 220 and the dielectric layer 225. A top electrode 240 is disposed on the piezoelectric layer 230. Collectively, the bottom electrode 220, the piezoelectric layer 230, and the top electrode 240 constitute an acoustic stack of the acoustic resonator 200-1. A passivation layer (not shown) may be disposed on a top surface of the top electrode 240, as well as any exposed portion of a top surface of the piezoelectric layer 230, where the passivation layer has a thickness sufficient to insulate all layers of the acoustic stack from the environment, including protection from moisture, corrosives, contaminants, debris and the like.

Applying the piezoelectric layer 230 on a planarized surface, such as the combined planarized surface 229 of the bottom electrode 220 and the dielectric layer 225, generally improves the quality the piezoelectric layer 230. For example, the presence of the combined planar top surface tends to improve structural and operational stability of piezoelectric layer 230, as well as the acoustic resonator 200-1 overall. The presence of the planarized surface 229 also improves the quality of growth of subsequent layers, particularly the piezoelectric layer 230, as well as the top electrode 240 and the passivation layer (if any). Furthermore, the presence of the dielectric layer 225 enables the bottom electrode 220 to be formed without extending entirely over the cavity 208, if desired. Further examples of potential benefits of planarization are presented in U.S. Patent App. Pub. No. 2013/0106534 to Burak et al., which is hereby incorporated by reference in its entirety.

Referring to FIG. 2C, acoustic resonator 200-2 is substantially the same as acoustic resonator 200-1, except that the cavity 208 is replaced by an acoustic mirror, shown as representative DBR 210, although other types of acoustic reflectors may be incorporated without departing from the scope of the present teachings. That is, in the depicted embodiment, the acoustic resonator 200-2 comprises substrate 205 and DBR 210 disposed on a top surface of the substrate 205, and bottom electrode 220, which does not extend the full length of the DBR 210.

In various embodiments, the DBR 210 includes multiple pairs of acoustic reflector layers, indicated by representative first acoustic reflector layer pair 211 and second acoustic reflector layer pair 212 sequentially stacked on a top surface of the substrate 205. The first acoustic reflector layer pair 211 includes first low acoustic impedance layer 211a formed of low acoustic impedance material stacked on first high acoustic impedance layer 211b formed of high acoustic impedance material. The second acoustic reflector layer pair 212 includes second low acoustic impedance layer 212a formed of low acoustic impedance material stacked on second high acoustic impedance layer 212b formed of high acoustic impedance material.

The first and second low acoustic impedance layers 211a and 212a, and the first and second high acoustic impedance layers 211b and 212b, may be formed with respective thicknesses corresponding to a quarter wavelength of a natural resonance frequency of acoustic resonator 200-2, for example. Generally, the amount of acoustic isolation provided by DBR 210 depends on the contrast between the acoustic impedances of adjacent acoustic impedance layers and a total number of layers forming DBR 210, with a greater amount of contrast and larger number of layers creating better acoustic isolation. In some embodiments, the DBR 210 is formed of pairs of dielectric materials having contrasting acoustic impedances. In alternative embodiments one or both of the low and high acoustic impedance layers may be formed of metal material having contrasting acoustic impedances.

In the depicted representative embodiment, the DBR 210 comprises two pairs of acoustic impedance layers, first acoustic reflector layer pair 211 and second acoustic reflector layer pair 212. The first low acoustic impedance layer 211a of the first acoustic reflector layer pair 211 is formed of a material having relatively low acoustic impedance (which may be a relatively soft material). For example, the first low acoustic impedance layer 211a may be formed of boron silicate glass (BSG), tetra-ethyl-ortho-silicate (TEOS), silicon oxide ($SiO_x$) or silicon nitride ($SiN_x$) (where x is an integer), carbon-doped silicon oxide (CDO), chemical vapor deposition silicon carbide (CVD SiC), plasma enhanced CVD SiC (PECVD SiC), niobium molybdenum (NbMo), titanium (Ti) or aluminum. The first high acoustic impedance layer 211b paired with the first low acoustic impedance layer 211a in the first acoustic reflector layer pair 211 is formed of a material having relatively high acoustic impedance (which may be a relatively hard material). For example, the first high acoustic impedance layer 211b may be formed of tungsten (W), molybdenum (Mo), iridium (Ir), hafnium oxide ($HfO_2$), aluminum oxide ($Al_2O_3$), diamond or diamond-like carbon (DLC). Likewise, the second low acoustic impedance layer 112a of the second acoustic reflector layer pair 112 is are formed of materials having relatively low acoustic impedances, and the second high acoustic impedance layer 212b paired with the second low acoustic impedance layer 112a in the second acoustic reflector layer pair 112 is formed of materials having relatively high acoustic impedances.

Of course, in various embodiments, the DBR 210 may include other numbers of acoustic reflector layer pairs, e.g., to achieve specific design objectives, without departing from the scope of the present teachings. Various illustrative fabrication techniques of acoustic mirrors are described by in U.S. Pat. No. 7,358,831 (Apr. 15, 2008), to Larson III, et al., which is hereby incorporated by reference in its entirety. Also, in various embodiments, the first and second low acoustic impedance layers 211a and 212a are formed of the same material as one another, and the first and second high acoustic impedance layers 211b and 212b are formed of the same material as one another. However, in alternative embodiments, the first and second low acoustic impedance layers 211a and 212a may be formed of different materials, and/or the first and second high acoustic impedance layers 211b and 212b may be formed of different materials, without departing from the scope of the present teachings.

Bottom electrode 220 is disposed on the DBR 210, and dielectric layer 225 is formed next to the bottom electrode 220 over the DBR 210. More particularly, the bottom electrode 220 is disposed on a top surface of the second low acoustic impedance layer 212a, and dielectric layer 225 is formed next to the bottom electrode 220 over the top surface of second low acoustic impedance layer 212a. The dielectric layer 225 is separated from the bottom electrode 220 and the DBR 210 (as opposed to the substrate 205, as discussed above) by the etch stop layer 250 remaining from the fabrication process. More particularly, the dielectric layer 225 is separated from the bottom electrode 220 by a substantially vertical portion 251 of the etch stop layer 250 and is separated from the DBR 210 by a substantially horizontal portion 252 of the etch stop layer 250. The top surfaces of the bottom electrode 220 and the dielectric layer 225, along with the exposed top end of the vertical portion 251 of the etch stop layer 250) are planarized, meaning that they collectively form combined planarized surface 229.

Piezoelectric layer 230 is disposed on the planarized surface 229 of the bottom electrode 220 and the dielectric layer 225. The top electrode 240 is disposed on the piezoelectric layer 230. Collectively, the bottom electrode 220, the piezoelectric layer 230, and the top electrode 240 constitute an acoustic stack of the acoustic resonator 200-2. As mentioned above, a passivation layer (not shown) may be disposed on the top surface of the top electrode 240, as well as any exposed portion of the top surface of the piezoelectric layer 230.

According to various embodiments, the acoustic resonator devices 200-1 and 200-2 may be fabricated using various techniques compatible with semiconductor processes. A non-limiting example of a fabrication process directed to representative acoustic resonator 200-1 is discussed below with reference to FIG. 3 and FIGS. 4A-4J. Notably, substantially the same process applies to fabricating representative acoustic resonator 200-2, except that the steps for forming the cavity 208 in the substrate 205 would be omitted, while steps for forming the DBR 210 on the substrate 205 would be included, as would be apparent to one of ordinary skill in the art. The various materials and order of application for forming the DBR 210 are discussed above, with regard to FIG. 2C.

Figure 3:
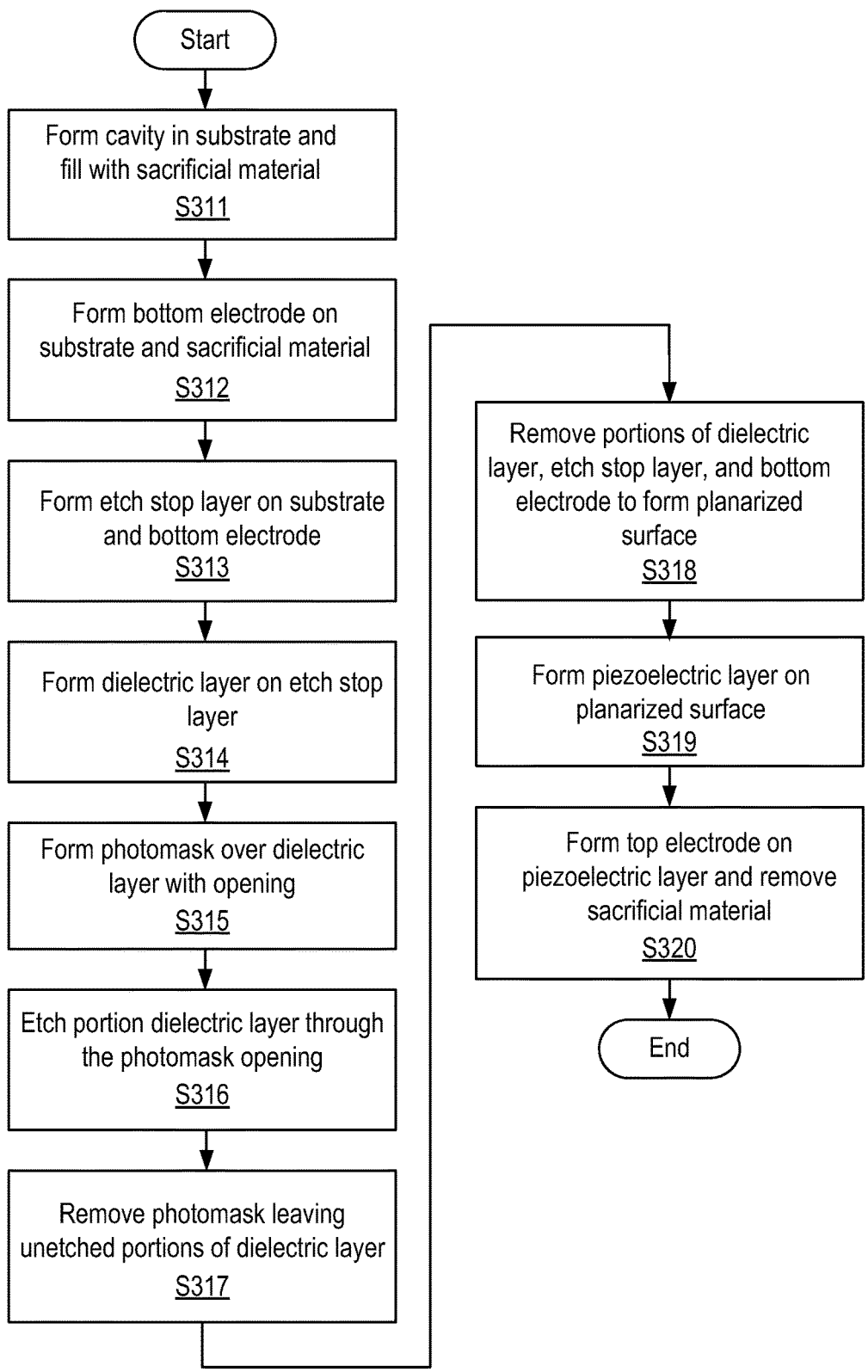
FIG. 3 is a flow diagram illustrating a method of fabricating an acoustic resonator device, according to a representative embodiment.

FIG. 3 is a flow diagram illustrating a method of fabricating an acoustic resonator device, according to a representative embodiment. FIGS. 4A-4J are cross-sectional diagrams illustrating the steps of the fabrication process of an acoustic resonator device, substantially corresponding to the operations depicted in FIG. 3, according to a representative embodiment.

Notable, for simplicity of explanation, FIGS. 4A-4J shown a single die for providing an acoustic resonator (e.g., acoustic resonator 200-1). It is understood, however, that the fabrication steps in FIG. 3 and the corresponding cross-sections in FIGS. 4A-4J may be performed simultaneously on multiple dies in wafer form, such that corresponding acoustic resonators devices (e.g., each of which would be the same as acoustic resonator 200-1 in the present example) may be formed during the fabrication process and separated (or singulated) upon completion, as would be apparent to one of ordinary skill in the art.

Figure 4A:
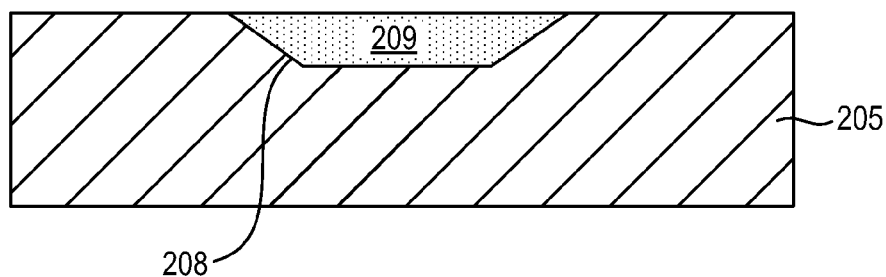
FIGS. 4A-4J are cross-sectional diagrams illustrating steps in a fabrication process of an acoustic resonator device, according to a representative embodiment.

In step S311 of FIG. 3, cavity 208 is formed in substrate 205, as shown in FIG. 4A. The cavity 208 may be formed by a dry etching process, such as a Bosch process or a conventional fluorine, chlorine or bromine based process, for example, although various alternative etching techniques may be incorporated without departing from the scope of the present teachings. The cavity 208 is initially filled with a sacrificial material 209, such as phosphosilicate glass (PSG). The substrate 205 and the sacrificial material 209 may be subjected to chemical mechanical polishing (CMP) in order to form a top planarized surface. Ultimately, following formation of the top electrode 240, for example, the sacrificial material within the cavity 208 is etched away leaving an air cavity, as discussed below with reference to FIG. 4J. Various illustrative fabrication techniques for forming a cavity in a substrate are described by U.S. Pat. No. 7,345, 410 (Mar. 18, 2008), to Grannen et al., which is hereby incorporated by reference in its entirety.

The substrate 205 may be formed of various types of semiconductor materials compatible with semiconductor processes, such as silicon (Si), gallium arsenide (GaAs), indium phosphide (InP), or the like, which is useful for integrating connections and electronics, thus reducing size and cost. In various embodiments, the substrate 205 may be formed of or otherwise include an insulating material, such as glass, sapphire, alumina or the like.

Figure 4B:
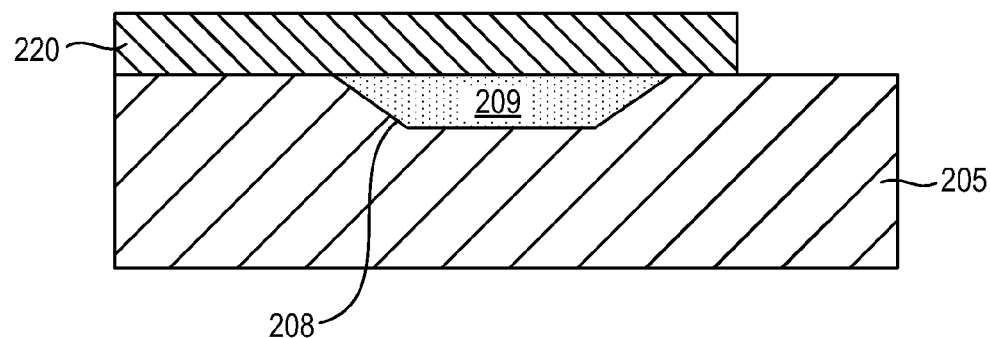

In step S312 of FIG. 3, bottom electrode 220 is formed on the substrate 205 and the cavity 208 containing the sacrificial material 209, as shown in FIG. 4B. The bottom electrode 220 may be formed by sputter deposition or chemical vapor deposition (CVD), for example, of one or more electrically conductive metal materials, such as tungsten (W), molybdenum (Mo), copper (Cu) or aluminum (Al). In various configurations, the bottom electrode 220 may be formed as a single layer of material, or the bottom electrode 220 may be a composite electrode formed of two or more different conductive materials, such as metals having different sound velocities and acoustic impedances. When the bottom electrode 220 is a composite electrode, it may include various lateral features, such as integrated low velocity frames or integrated high velocity frames. Various integrated lateral features are described, for example, in U.S. patent application Ser. No. 13/660,941 (filed Oct. 25, 2012) to Burak et al. (issued as U.S. Pat. No. 9,425,764 on Aug. 23, 2016), the disclosure of which is hereby incorporated by reference in its entirety. The bottom electrode 220 may be formed to have a first thickness of approximately 1000 Angstroms (Å) to approximately 20000 Å, for example.

Figure 4C:
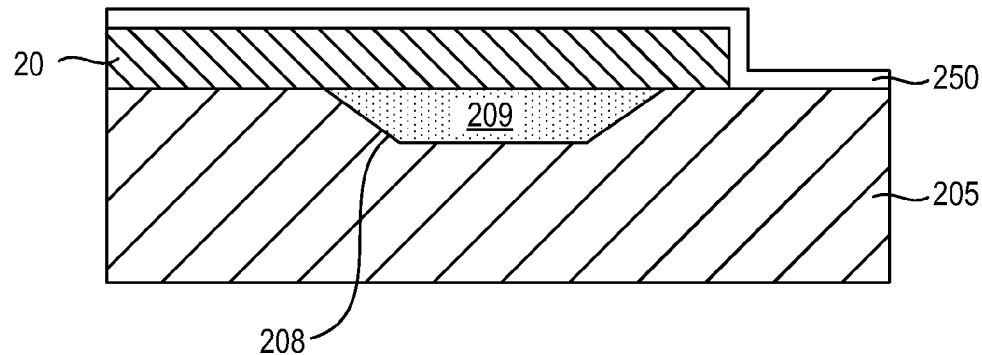

Etch stop layer 250 is formed on the substrate 205 and the bottom electrode 220 in step S313, as shown in FIG. 4C. The etch stop layer 250 may be formed by sputter deposition or plasma enhanced CVD (PECVD), for example, of an etch-resistant material, such as aluminum nitride (AlN) or diamond-like carbon (DLC). The etch stop layer 250 is relatively thin in comparison to the bottom electrode 220. For example, the etch stop layer 250 may be formed to have a thickness of approximately 300 Å.

Figure 4D:
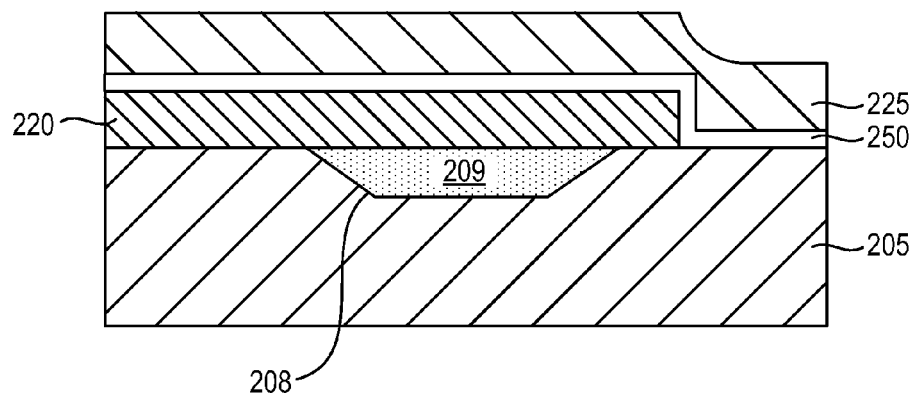

In step S314, dielectric layer 225 is formed on the etch stop layer 250, as shown in FIG. 4D. The dielectric layer 225 be formed by sputter deposition or PECVD, for example, of one or more dielectric materials, such as boro-silicate glass (BSG), silicon dioxide ($SiO_2$), silicon nitride (SiN), or a polymeric material. The dielectric layer 225 may be formed to have a second thickness, which may be greater than the first thickness of the bottom electrode 220. For example, the dielectric layer 225 may be formed at a second thickness of approximately 2000 Å to approximately 23000 Å. Generally, the second thickness is at least about 10 percent greater than the first thickness. In alternative configurations, the second thickness of the dielectric layer 225 may be the same as or thinner than the first thickness of the bottom electrode 220, depending on various factors, such as the thickness of the etch stop layer 250.

Figure 4E:
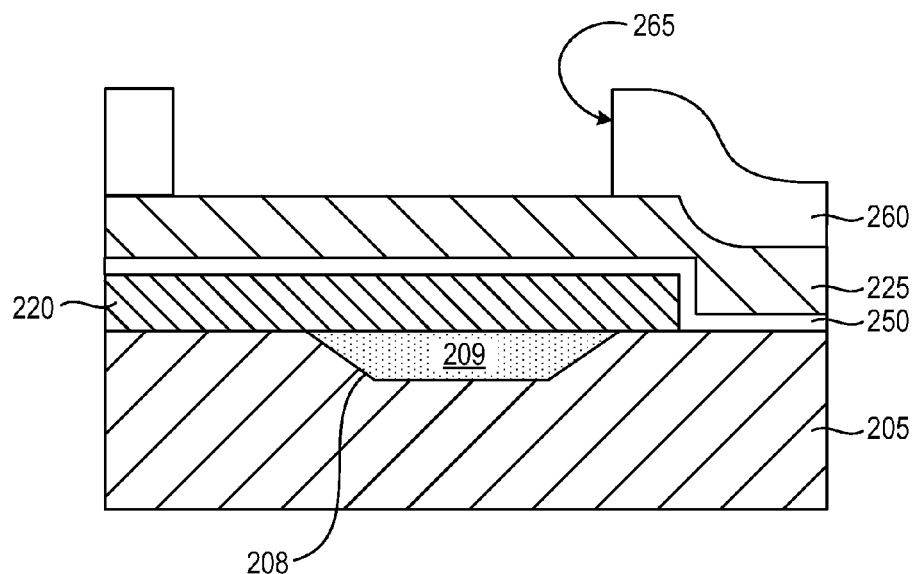

A photomask 260 is formed over the dielectric layer 225 in step S315. More particularly, a photoresist layer is applied to a top surface of the dielectric layer 225, and is then patterned to provide a photoresist pattern or photomask 260, as shown in FIG. 4E. The photomask 260 may be formed using any photoresist compatible with semiconductor processes, as would be apparent to one of ordinary skill in the art. The photomask 260 may be formed by machining or by chemically etching the photoresist layer using photolithography, although various alternative techniques may be incorporated, without departing from the scope of the present teachings. The resulting photomask 260 includes opening 265, which is substantially centered over the bottom electrode 220, such that the opening 265 is slightly smaller than the bottom electrode 220. That is, the opening 265 slightly overlaps the edges of the bottom electrode 220 enough to avoid trenching.

Figure 4F:
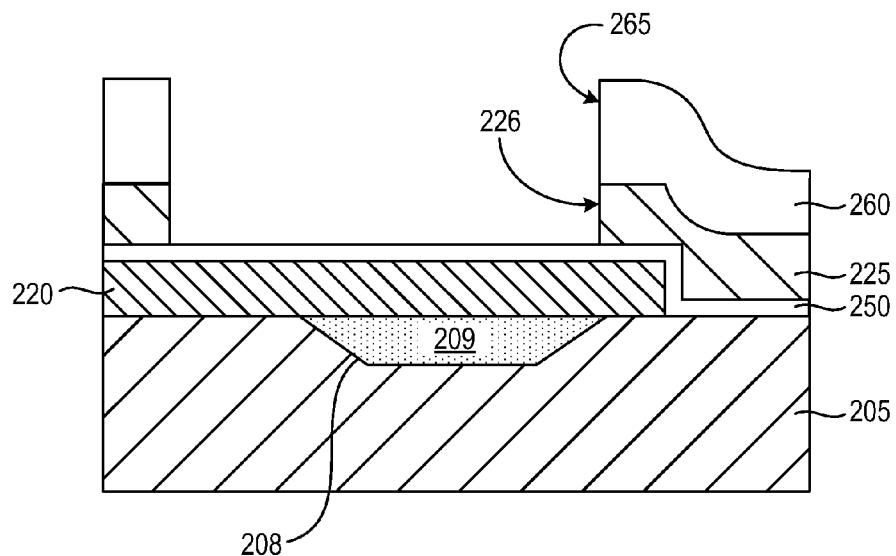

In step S316, a portion the dielectric layer 225 is etched away through the opening 265 of the photomask 260 to the etch stop layer 250, creating a corresponding opening 226 in the dielectric layer 225, as shown in FIG. 4F. The etching may be performed using a fluorine plasma etch, for example, although other types of etching may be incorporated, e.g., depending on the dielectric material of the dielectric layer 225. For example, if the dielectric material is an organic material, the etching process may include an oxygen plasma etch. The opening 226 through the dielectric layer 225 likewise is slightly smaller than the bottom electrode 220, such that the outer edges of the bottom electrode 220 are still covered by un-etched portions of the dielectric layer 225 (as well as the etch stop layer 250), discussed below. Also, although the opening 226 is shown as having substantially parallel side walls, it is understood that various embodiments may include side walls of any shape, such as tapered side walls to provide a substantially conical shaped opening 226.

Figure 4G:
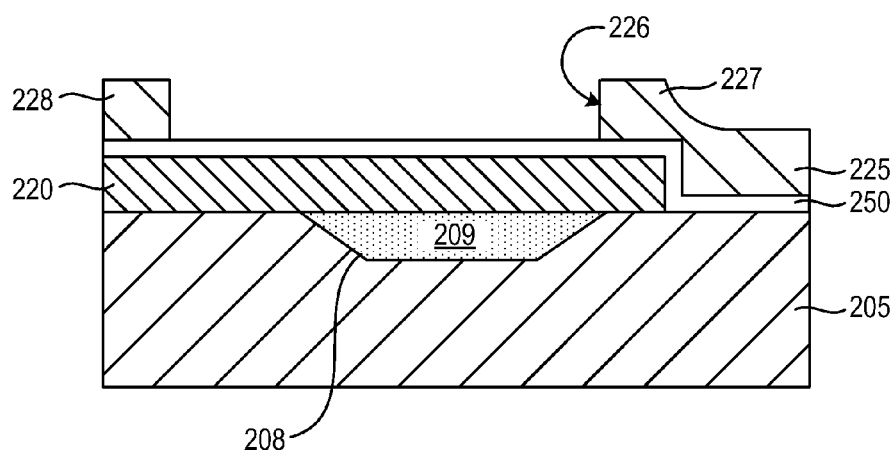

The photomask 260 is removed in step S317, leaving the etch stop layer 250 and the un-etched portions of the dielectric layer 225, as shown in FIG. 4G. The photomask 260 may be chemically released or etched, for example, using solvent stripping (e.g., HF etch solution) or oxygen plasma. However, the photomask 260 may be removed by various other techniques, without departing from the scope of the present teachings. The un-etched portions of the dielectric layer 225 include un-etched protruding portions 227 and 228 of the dielectric layer 225, which are located near the outer edges of the bottom electrode 220 (around the opening 226 of the dielectric layer 225).

Figure 4H:
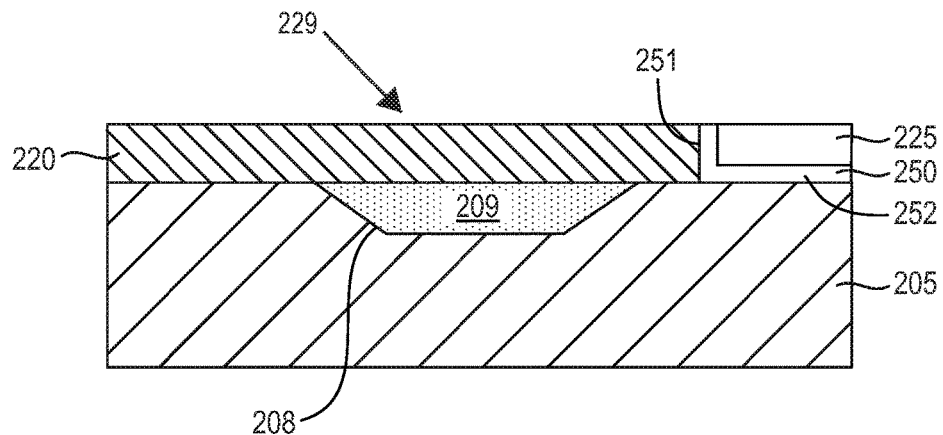

In step S318, the protruding portions 227 and 228 of the dielectric layer 225 and a portion of the etch stop layer 250 located over the bottom electrode 220, as well as a minimal portion of the bottom electrode 220 in some circumstances (such that the bottom electrode still has substantially the first thickness), are removed to provide a planarized surface 229. The protruding portions 227 and 228, the portion of the etch stop layer 250 located over the bottom electrode 220, and the portion of the bottom electrode 220 may be removed by a polishing process, such as a chemical mechanical polishing (CMP) process using a silica slurry, for example. Of course, various other techniques may be incorporated, without deporting from the scope of the present teachings. For example, the etch stop layer 250 located over the bottom electrode 220 may be removed in a separate oxygen plasma etch step. The resulting planarized surface 229 includes a top surface of the bottom electrode 220 and an adjacent top surface of the remaining dielectric layer 225, as shown in FIG. 4H. At this point, the dielectric layer 225 may be referred to as the planarization layer. In addition, the planarized surface 229 includes an exposed top end of the vertical portion 251 of the etch stop layer 250. That is, any part of the etch stop layer 250 not exposed to the polishing process remains in the acoustic resonator 200-1. For example, as discussed above, the remaining vertical portion 251 separates the bottom electrode 220 from the adjacent dielectric layer 225, and a remaining horizontal portion 252 of the etch stop layer 250 separates the dielectric layer 225 from the substrate 205.

Figure 4I:
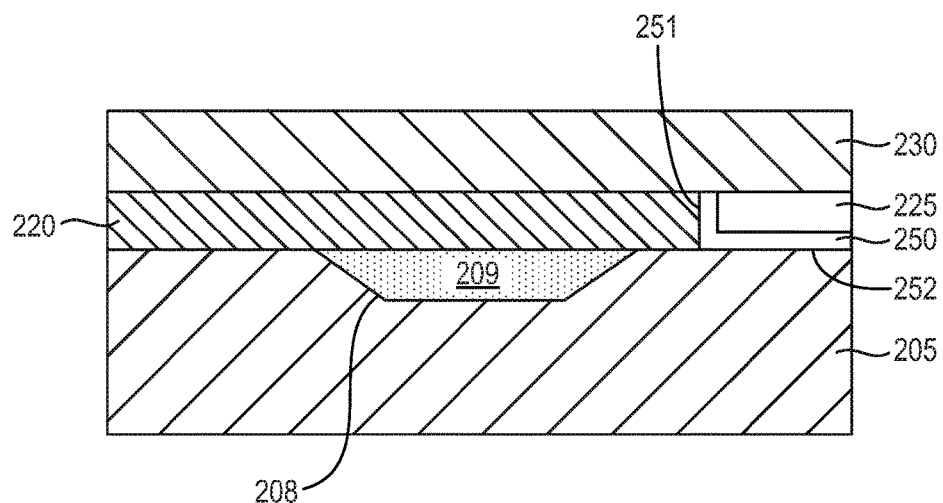

Piezoelectric layer 230 is formed on the planarized surface 229 in step S319, as shown in FIG. 4I. The planarized surface 229 is very smooth, and promotes efficient growth of the piezoelectric layer 230. The piezoelectric layer 230 may be formed by sputter deposition of any piezoelectric material compatible with semiconductor processes, such as aluminum nitride (AlN), zinc oxide (ZnO), or lead zirconate titanate (PZT), for example. Of course, other materials may be incorporated into the piezoelectric layer 230 without departing from the scope of the present teachings. Also, in various embodiments, piezoelectric layer 230 may be "doped" with one or more rare earth elements, such as scandium (Sc), yttrium (Y), lanthanum (La), or erbium (Er), for example. Examples of doping piezoelectric layers with one or more rare earth elements for improving electromechanical coupling coefficient $Kt^2$, for example, are provided by U.S. patent application Ser. No. 13/662,425 (filed Oct. 27, 2012), to Bradley et al. (issued as U.S. Pat. No. 9,225,313 on Dec. 29, 2015), and U.S. patent application Ser. No. 13/662,460 (filed Oct. 27, 2012), to Grannen et al. (issued as U.S. Pat. No. 9,136,819 on Sep. 15, 2015), which are hereby incorporated by reference in their entireties.

Forming the piezoelectric layer 230 on the planarized surface 229 (as opposed to a varied surface, as shown in FIG. 1, for example) provides substantial benefits. For example, forming the piezoelectric layer 230 on the planarized surface 229 reduces cracks and voids in the piezoelectric layer 230, thereby improving structural and operational integrity of the piezoelectric layer 230, as well as the acoustic resonator 200-1 overall. Also, the reduction in cracks and voids increases the breakdown voltage of the piezoelectric layer 230 formed on the planarized surface 229, enabling the piezoelectric layer 230 to withstand higher electro-static discharge (ESD) stresses. The piezoelectric layer 130 may be formed to have a thickness of approximately 3000 Å to approximately 25000 Å, for example. Notably, forming the piezoelectric layer 230 on the planarized surface 229 enables formation of a thinner piezoelectric layer 230, particularly when incorporating piezoelectric materials doped with rare earth elements, as mentioned above. For example, when the piezoelectric layer 230 is doped with about 5 atomic percent scandium (Sc), the thickness of the piezoelectric layer 230 may be as small as about 3000 Å, which is less than a conventionally applied doped (or undoped) piezoelectric layer.

Figure 4J:
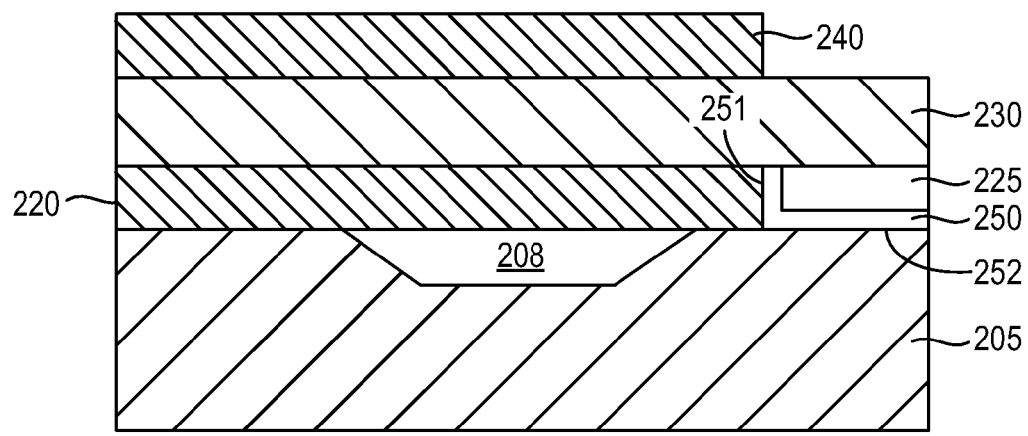

In step S320, top electrode 240 is formed on the piezoelectric layer 230 and the sacrificial material 209 is released from the cavity 208, leaving an air cavity, to provide the representative acoustic resonator 200-1, as shown in FIG. 4J. For example, the sacrificial material 209 may be etched away illustratively using HF etching, as would be apparent to one of ordinary skill in the art. The top electrode 240 may be formed by sputter deposition or PECVD, for example, of one or more electrically conductive metal materials, such as tungsten (W), molybdenum (Mo), copper (Cu), or aluminum (Al). In various configurations, the top electrode 240 may be formed as a single layer of material, or the top electrode 240 may be a composite electrode formed of two or more different conductive materials, such as metals having different sound velocities and acoustic impedances, as discussed above with regard to the bottom electrode 220. When the top electrode 240 is a composite electrode, it may include various lateral features, such as integrated low velocity frames or integrated high velocity frames. The thickness of the top electrode may be approximately 1000 Å to approximately 20000 Å, for example, although the top electrode 240 may have the same or different thickness as the bottom electrode 220. Likewise, the top electrode 240 may have the same or a different composition as the bottom electrode 220. For example, the bottom and top electrodes 220 and 240 may be formed of the same or different materials, and/or one or both of the bottom and top electrodes 220 and 240 may be a composite electrode having one or more integrated lateral features.

A passivation layer (not shown) may optionally be formed over the acoustic resonator 200-1, conformably coating exposed surfaces (e.g., exposed top surfaces of the top electrode 240 and the piezoelectric layer 230). The passivation layer may be formed of boro-silicate glass (BSG), silicon dioxide ($SiO_2$), silicon nitride (SiN), or polysilicon, for example.

As mentioned above, FIGS. 3 and 4A-4J are directed to fabrication of representative acoustic resonator 200-1 for purposes of illustration. However, the majority of the steps may be incorporated in forming other types of acoustic resonators having a planarization layer. For example, in order to fabricate representative acoustic resonator 200-2, shown in FIG. 2C, step S311 would be omitted since no cavity (cavity 208) would be included in the substrate 205. Rather, this step would be replaced by formation of an acoustic reflector (e.g., DBR 210) on the substrate 205. That is, the DBR 210 comprises second acoustic reflector layer pair 212 stacked on first acoustic reflector layer pair 211. Thus, in order to form the DBR 210, first high acoustic impedance layer 211b would be formed on the substrate 205, first low acoustic impedance layer 211a would be formed on the first high acoustic impedance layer 211b, second high acoustic impedance layer 212b would be formed on the first low acoustic impedance layer 211a, and second low acoustic impedance layer 212a would be formed on the second high acoustic impedance layer 212b, by sputter deposition, respectively, for example. The bottom electrode 220 and a portion of the etch stop layer 250 (as shown in FIGS. 4B and 4C) would then be formed on the second low acoustic impedance layer 212a as opposed to a top surface of the substrate 205. The remaining steps (shown in FIGS. 4D-4J) would remain substantially the same (although no sacrificial material would need to be released from a cavity).

As mentioned above, the fabrication steps depicted in FIGS. 4A-4J may be performed on a wafer to form simultaneously multiple dies. In this case, adjacent acoustic resonators 200-1 are then cut or separated from the wafer to form singulated dies, such as the representative acoustic resonator 200-1 shown in FIGS. 2B, 2C and 4J. The dies may be separated using various techniques compatible with semiconductor fabrication processes, such as a scribe and break technique, for example.

Notably, the various embodiments are not limited to providing a planarized surface that includes a bottom electrode and a dielectric layer, on which to form a piezoelectric layer. Rather, the techniques may be applied to providing any planarized top surface. For example, in the case of a DBAR or an SBAR, a planarized surface including a top electrode and a dielectric layer may be needed on which to form another resonator or other electronic device. Similarly, a planarized surface may be needed on which to form low and/or high acoustic impedance layers of an acoustic mirror.

The fabrication steps involved would be substantially the same as described above, except that the materials providing the planarized surface may be formed over a base layer other than a semiconductor substrate. For example, to form a DBAR or an SBAR, the electrode is formed over a piezoelectric layer; the etch stop layer is formed over the electrode and the piezoelectric layer; and the dielectric layer is formed on the etch stop layer over the electrode and the piezoelectric layer. To expose the electrode, a photomask is formed over the dielectric layer to define an opening over the electrode, where the opening is slightly smaller than the electrode, and a portion the dielectric layer is etched through the opening of the photomask to the etch stop layer to create a corresponding opening in the dielectric layer. Removal of the photomask leaves un-etched protruding portions of the dielectric layer around the opening in the dielectric layer. The protruding portions are removed, along with a portion of the etch stop layer located over the electrode and a minimal portion of the electrode, to provide the planarized surface comprising a top surface of the electrode and an adjacent top surface of the dielectric layer deposited over the piezoelectric layer and an exposed top of the etch stop layer. If the electrode does not need to be exposed, then the planarizing operation (e.g., using CMP) may be performed without the photomask and etching steps.

In various embodiments, the thicknesses and/or materials of the various layers may vary to provide unique benefits for any particular situation or to meet application specific design requirements of various implementations, as would be apparent to one skilled in the art.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A method of fabricating a bulk acoustic wave (BAW) resonator device, comprising:
   forming a bottom electrode over a substrate;
   forming an etch stop layer over the bottom electrode and the substrate;
   forming a dielectric layer on the etch stop layer over the bottom electrode and the substrate;
   forming a photomask over the dielectric layer, the photomask defining an opening over the bottom electrode, wherein the opening is slightly smaller than the bottom electrode;
   etching a portion of the dielectric layer through the opening of the photomask to the etch stop layer to create a corresponding opening in the dielectric layer and un-etched protruding portions of the dielectric layer;
   removing the photomask, leaving the un-etched protruding portions of the dielectric layer around the opening in the dielectric layer; and
   removing at least the un-etched protruding portions of the dielectric layer and a portion of the etch stop layer located over the bottom electrode to provide a planarized surface comprising a top surface of the bottom electrode and an adjacent top surface of the dielectric layer deposited over the substrate.

2. The method of claim 1, further comprising:
   forming a piezoelectric layer on the planarized surface.

3. The method of claim 2, wherein forming the piezoelectric layer on the planarized surface reduces cracks and voids in the piezoelectric layer.

4. The method of claim 3, wherein forming the piezoelectric layer on the planarized surface increases a breakdown voltage of the piezoelectric layer.

5. The method of claim 4, wherein forming the piezoelectric layer on the planarized surface enables the piezoelectric layer to withstand higher electro-static discharge (ESD).

6. The method of claim 2, wherein the piezoelectric layer comprises aluminum nitride doped with one or more rare earth elements.

7. The method of claim 6, wherein the one or more rare earth elements comprises scandium (Sc).

8. The method of claim 1, wherein the un-etched protruding portions of the dielectric layer and the etch stop layer are removed by a polishing process.

9. The method of claim 8, wherein the polishing process comprises chemical mechanical polishing (CMP) process using a silica slurry.

10. The method of claim 1, wherein the bulk acoustic wave (BAW) resonator device comprises a thin film bulk acoustic resonator (FBAR), and the bottom electrode is formed over a cavity in the substrate initially containing a sacrificial material.

11. The method of claim 1, wherein the bulk acoustic wave (BAW) resonator device comprises a solidly mounted resonator (SMR), and the bottom electrode is formed over a low acoustic impedance layer of an acoustic reflector.

12. The method of claim 1, wherein the etch stop layer comprises one of aluminum nitride (AlN) and diamond-like carbon (DLC).

13. The method of claim 1, wherein the dielectric layer comprises one of bow-silicate glass (BSG), silicon dioxide ($SiO_2$), and silicon nitride (SiN).

14. The method of claim 1, wherein the dielectric layer comprises a polymeric material.

15. The method of claim 1, wherein a thickness of the dielectric layer is at least about 10 percent greater than a first thickness of the bottom electrode.

16. A method of fabricating a resonator device, comprising:
   forming an electrode over a base layer;
   forming an etch stop layer over the electrode and the base layer;
   forming a dielectric layer on the etch stop layer over the electrode and the base layer;
   forming a photomask over the dielectric layer, the photomask defining an opening over the electrode, wherein the opening is slightly smaller than the electrode;
   etching a portion of the dielectric layer through the opening of the photomask to the etch stop layer to create a corresponding opening in the dielectric layer and un-etched protruding portions of the dielectric layer;
   removing the photomask, leaving the un-etched protruding portions of the dielectric layer around the opening in the dielectric layer; and
   removing the un-etched protruding portions of the dielectric layer, a portion of the etch stop layer located over the electrode, and a minimal portion of the electrode to provide a planarized surface comprising a top surface of the electrode and an adjacent top surface of the dielectric layer deposited over the base layer.

\* \* \* \* \*